United States Patent
Horng et al.

(10) Patent No.: US 7,746,652 B2
(45) Date of Patent: Jun. 29, 2010

(54) COOLING MODULE RETENTIONER

(75) Inventors: Alex Horng, Kaohsiung (TW);
Chin-Ming Kuo, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 269 days.

(21) Appl. No.: 11/902,227

(22) Filed: Sep. 20, 2007

(65) Prior Publication Data

US 2008/0013280 A1    Jan. 17, 2008

(30) Foreign Application Priority Data

Aug. 17, 2007  (TW) .............................. 96130461 A

(51) Int. Cl.
*H05K 7/20*  (2006.01)
*H01L 23/34*  (2006.01)
*F28F 7/00*  (2006.01)
*A44B 21/00*  (2006.01)

(52) U.S. Cl. .................. 361/719; 361/697; 361/709; 257/719; 165/80.3; 174/16.3; 24/458; 24/520

(58) Field of Classification Search ................. 361/695, 361/697, 704, 709, 710; 257/718–719; 165/80.2–80.3, 165/185; 174/16.3, 16.1; 24/458, 520, 459
See application file for complete search history.

(56) References Cited

U.S. PATENT DOCUMENTS

| 6,449,152 | B1 * | 9/2002 | Lin | ............................. 361/697 |
| 6,640,884 | B1 * | 11/2003 | Liu | ............................. 165/80.3 |
| 2005/0219823 | A1 * | 10/2005 | Yu et al. | ..................... 361/704 |

* cited by examiner

*Primary Examiner*—Zachary M Pape
(74) *Attorney, Agent, or Firm*—Bacon & Thomas, PLLC

(57) ABSTRACT

The present invention relates to a cooling module retentioner, which includes a fixing base and a flexible frame. The fixing base surrounds a heat-generating electronic component at a center and allows the placement of a cooling module therein, and a rising corner column is disposed at each of four corners thereof and each corner column has a snap hole; the flexible frame is composed of two M-like retention brackets whose bottom sides are mounted with a retention hook respectively for the corresponding snap hole, a lever is pivotally disposed at a lower center location thereof and pertains to a metal rod whose one end is integrally bent to form a protruded portion. The production process requires no mold so as to simplify the production process and reduce the production cost.

6 Claims, 5 Drawing Sheets

US 7,746,652 B2

COOLING MODULE RETENTIONER

FIELD OF THE INVENTION

The present invention relates to a cooling module retentioner, and more particularly to a practical structure that simplifies production process to reduce production cost thereof.

BACKGROUND OF THE INVENTION

A cooling module structure mainly includes a heat sink and a cooling fan. The heat sink has two heat contact surfaces, in which the first heat contact surface is a heat conduction surface between heat-generating electronic components and a bottom surface of the heat sink, and the second heat contact surface is a thermal convection surface between cooling fins of the heat sink and the cooling fan. To elaborate the maximum efficacy of heat conduction, the heat conduction surface between the bottom of the heat sink and the heat-generating electronic components shall be tightly bonded. Otherwise, no matter how high the efficacy of the cooling module is, once there is any gap between the bottom surface of the heat sink and the heat-generating electronic components, the cooling efficacy will be greatly alleviated.

The function of the retentioner is to firmly fasten the cooling module above the heat-generating electronic components on the one hand and to be closely sandwiched by the bottom surface of the heat sink and the heat-generating electronic components to make the most of the heat conduction efficacy.

A conventional cooling module retentioner structure is illustrated in Taiwan Patent Publication No. M246991 entitled "Fixing device of heat sink" and Taiwan Patent Publication No. M258557 entitled "Heat sink retentioner" respectively. Not only are those retentioners disclosed by the two patents complex structurally, but also all components must be manufactured through their own molding and then assembled together. The costs for equipment, material and human labor are extremely high.

Above all, as heat-generating electronic components are made by different vendors or specifications, the cooling module retentioners thereof are usually not interchangeable. In view of different packaging techniques adopted by heat-generating electronic components, the requirements for holding pressure of retentioners also vary. If a retentioner with the inconsistent specification is inadequately applied, the heat-generating electronic components is often damaged while mounting the cooling module. In other words, if a conventional retentioner intends to comply with the requirements of heat-generating electronic components with different specifications, the retentioners matching therewith shall be separately molded and manufactured, thereby simply increasing the complexity and difficulty of production and assembly process.

SUMMARY OF THE INVENTION

In view of the foregoing concern, the present invention thus provides a cooling module retentioner targeting at simplifying production process and reducing production cost, which includes:

a fixing base mounted on a circuit board to surround a heat-generating electronic component at a center and enabling the cooling module to be placed directly in contact with the heat-generating electronic component, wherein four corners of the fixing base each has a rising corner column, and each corner column has a retention hole; and a flexible frame composed of two M-like retention brackets integrally formed with two connection bars therebetween, having a retention hook formed on each bottom end of the two retention brackets for snapping in the retention hole of the fixing base, having a pivot part disposed at a lower central location of each of the two retention brackets for pivotally mounting a lever, wherein the lever is a metal rod whose one end is integrally bent to form a protruded portion, and a 90° included angle is formed between the protruded portion and the lever.

The cooling module shall have at least two pressing portions for the two retention brackets to stride across respectively, so as to drive a bottom edge of the protruded portion to directly urge against the pressing portion while the lever is pressed down. As the lever is pivotally mounted to a lower central position of the M-like retention bracket, the cooling module is subjected to a downward pressing force due to a counteraction force while the protruded portion of the lever urges against the pressing portion. Therefore the cooling module is forced to be in close contact with the heat-generating electronic component to ensure a good cooling effect.

DETAILED DESCRIPTION OF THE PREFERRED EMBODIMENT

To make the object, features and efficacy of the present invention more comprehensive, preferred embodiments of the present invention are enumerated along with the detailed illustrative description.

Figure 1:
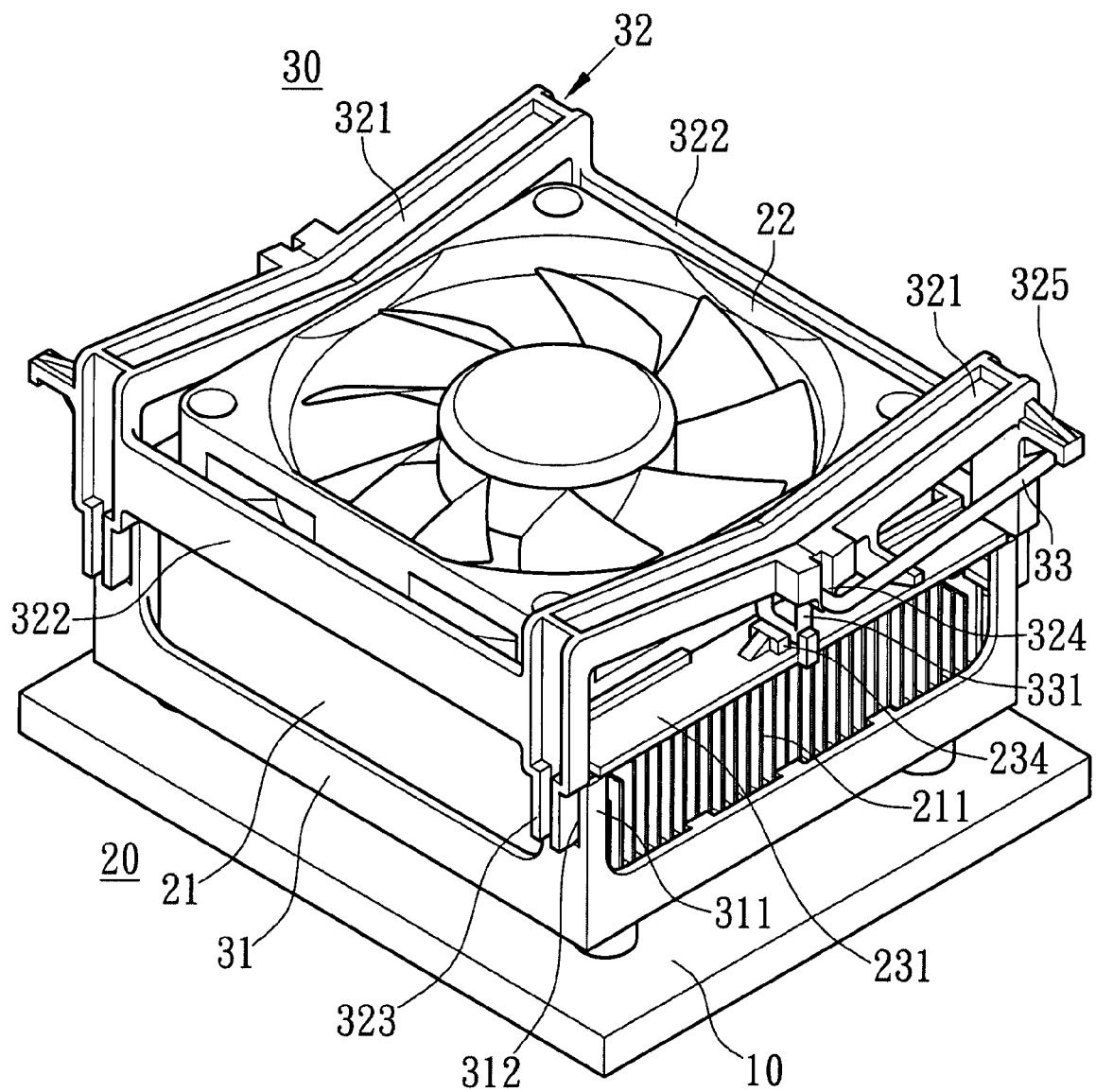
FIG. 1 is a 3D external schematic view of the present invention.
Figure 2:
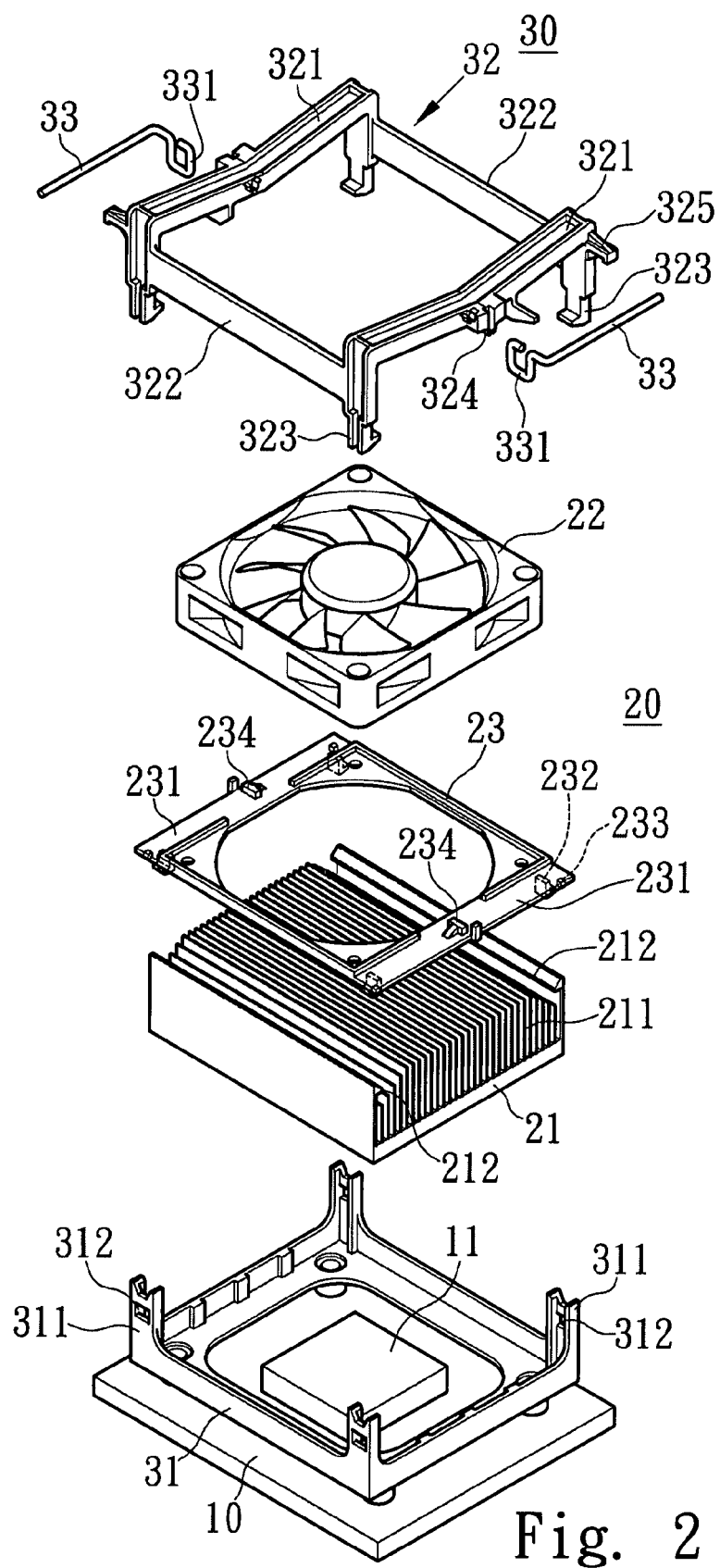
FIG. 2 is a 3D exploded schematic view of the present invention.

Please refer to FIG. 1 and FIG. 2. There is a heat-generating electronic component 11 mounted on a circuit board 10 and a cooling module 20 mounted above the heat-generating electronic component 11. A retentioner 30 of the present invention functions to fix the cooling module 20 and is closely attached to the top side of the heat-generating electronic component 11 to maintain a good cooling effect.

The cooling module 20 includes a heat sink 21 and a cooling fan 22. Various means between the heat sink 21 and the cooling fan 22 can be utilized to firmly integrate them. As illustrated in FIG. 2, both are assembled and fixed by virtue of an integration base 23.

The heat sink 21 is tightly contacted with the heat-generating electronic component 11 to directly absorb and conduct the heat generated by the heat-generating electronic component 11, and has a plurality of cooling fins 211 thereon, in which a retention flange 212 is formed on a respective top inner side of the outmost cooling fins 211.

The cooling fan 22 is fixed on the integration base 23, and a through hole is formed to correspond to an air outlet zone of the cooling fan 22. Moreover, a pressing portion 231 is extended beyond each of two opposite side edges of the integration base 23, and two hooks 232 and two stopper 233 are disposed on a bottom surface of each of the pressing portion 231 and a limit block 234 is disposed on a top surface thereof, in which two opposite hooks 232 can be engaged with a respective retention flange 212, and two opposite stoppers 233 exactly block both sides of the retention flange 212 to prevent the relative movement between the integration base 23 and the heat sink 21.

The retentioner 30 of the present invention includes a fixing base 31 and a flexible frame 32.

The fixing base 31 is mounted on a circuit board 10 to surround a heat-generating electronic component 11 at a center, and a rising corner column 311 is disposed at each of four corners and a snap hole 312 is disposed on each corner column 311.

The flexible frame 32 is composed of two M-like retention brackets 321, which are integrally combined with two connection bars 322. A retention hook 323 is formed on a bottom side of each of two side legs of the retention brackets 321, and a pivot part 324 is disposed at a lower central location of each of the two retention brackets 321 for pivotally mounting a lever 33.

The lever 33 is a metal rod whose one end is integrally bent to form a protruded portion 331 and an approximate 90° included angle is formed between the protruded portion 331 and the lever 33.

Figure 3:
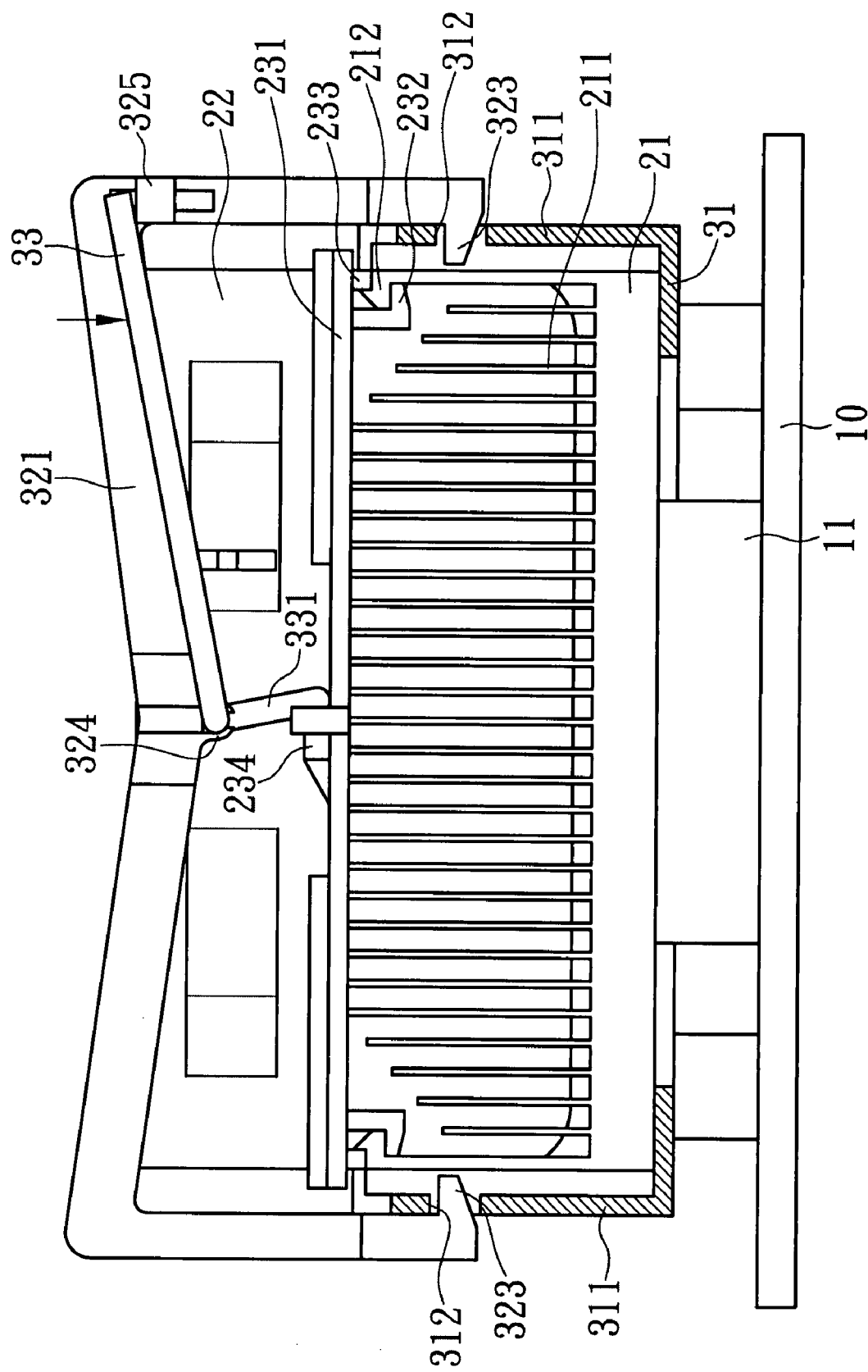
FIG. 3 is a schematic view showing planar movement of the present invention (1)

Together with the illustration of FIG. 2 and FIG. 3, when the retentioner 30 intends to fix the cooling module 20 above the heat-generating electronic component 11, the cooling module 20 shall be placed within the fixing base 31 and the flexible frame 32 is employed to press down the cooling module 20, so that the two retention brackets 321 are stridden across two opposite sides of the cooling fan 22 respectively and are located atop the pressing portions 231 of the fixing base 23 respectively, and the retention hooks 323 thereof are snapped in the snap holes 312 of the fixing base respectively. By now it is certain that the cooling module 20 is fixed atop the heat-generating electronic component 11 and is free of the concern of disengagement.

Figure 4:
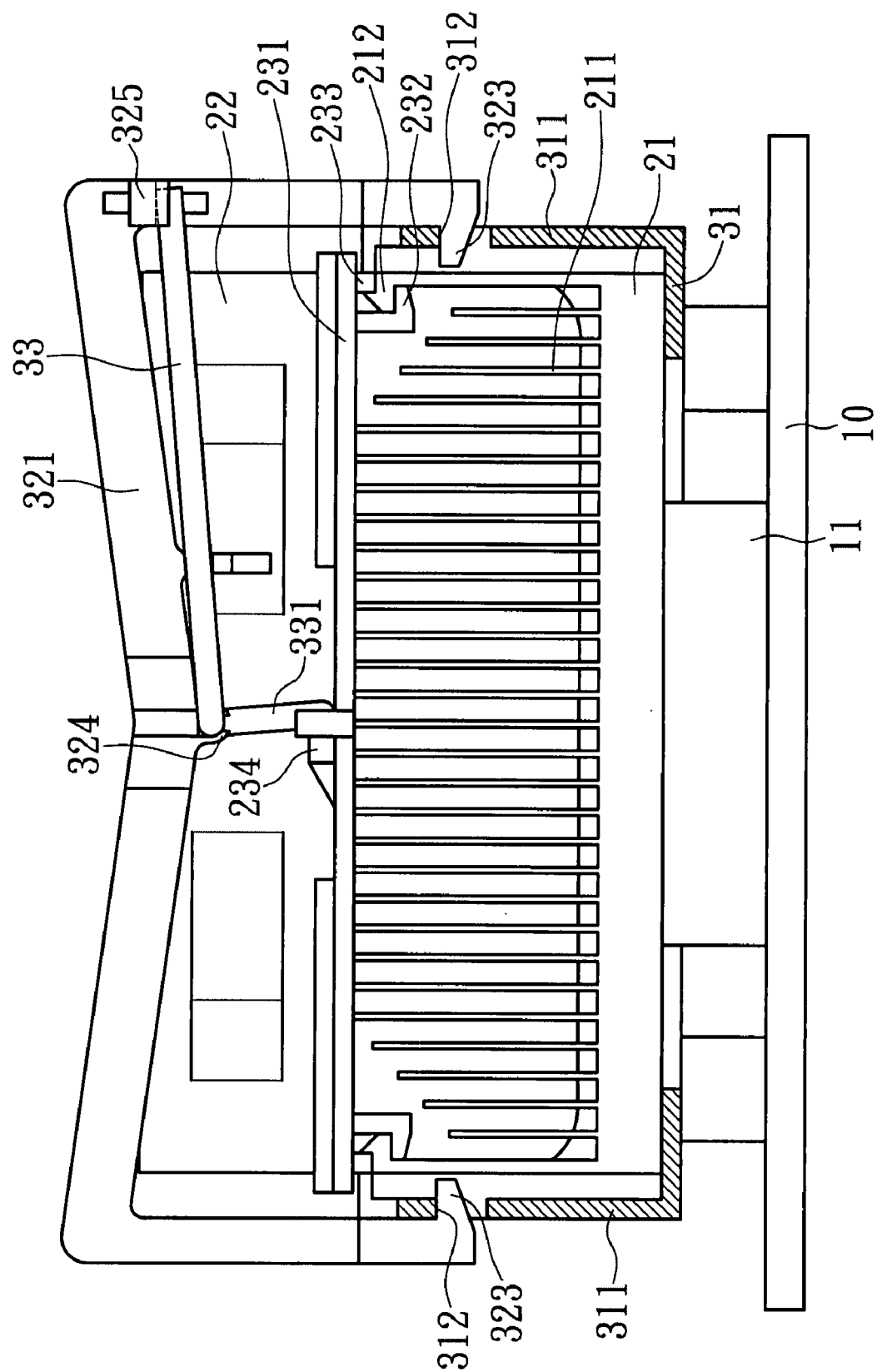
FIG. 4 is a schematic view showing planar movement of the present invention (2)

However, if intending to elaborate the maximum efficacy of heat conduction, a pressure must be applied to the cooling module 20 to make the bottom side of the heat sink 21 in close contact with the heat-generating electronic component 11. Therefore, as shown in FIG. 4, the lever 33 shall be pushed down to drive a bottom edge of each of the protruded portions 331 to directly urge against the respective pressing portion 231. As the lever 33 is pivotally disposed at a lower central position of each of the two M-like retention brackets 321, the cooling module 20 is exerted with a downward pressing force due to a counteraction force while the protruded portion 331 of the lever 33 urges against the pressing portion 231, so as to force the bottom side of the heat sink 21 to be closely contacted with the heat-generating electronic component 11. Besides, the limit block 234 on the pressing portion 231 and a fixing hook 325 on each of the retention brackets 321 can all provide the positioning function after the protruded portion 331 finishes its movement.

Figure 5:
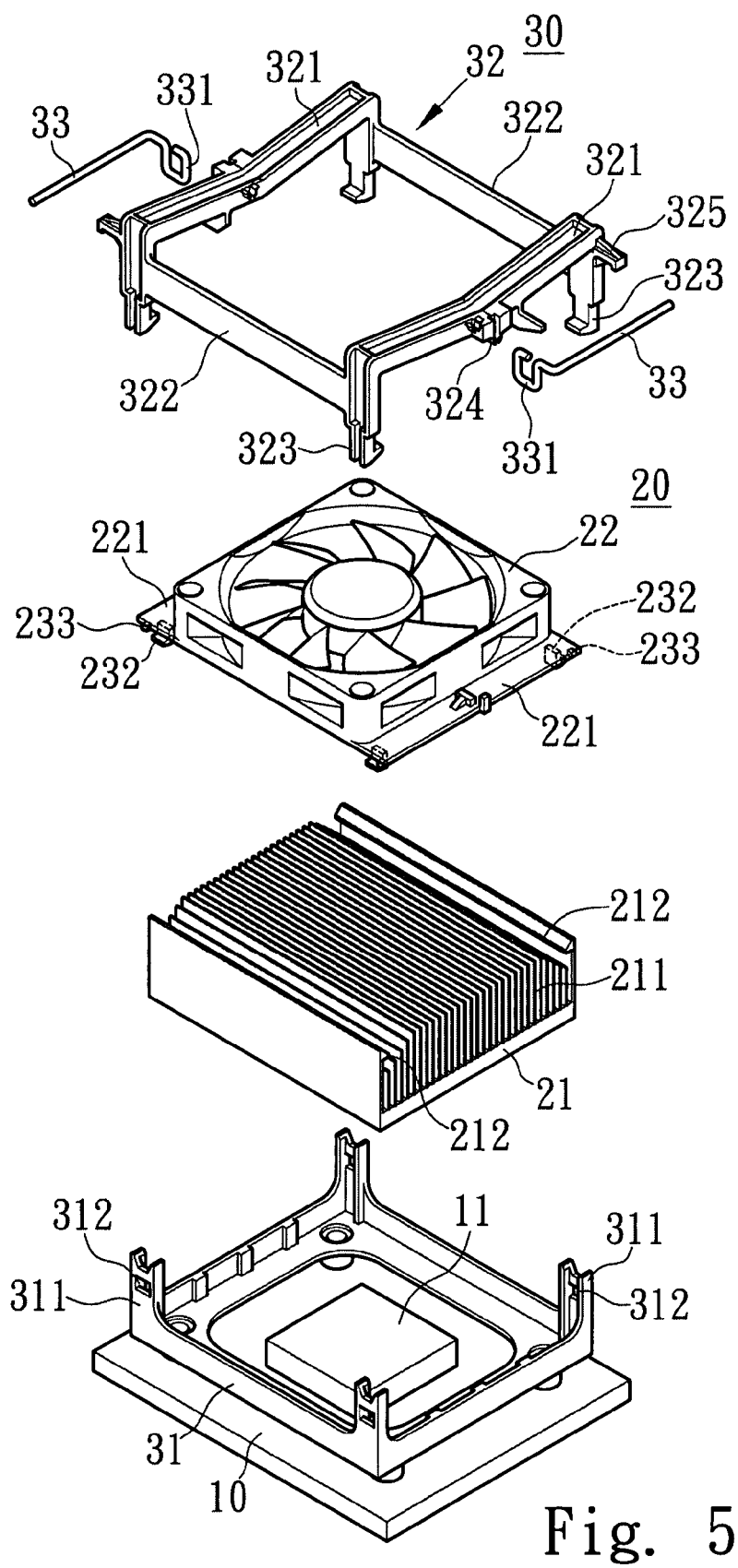
FIG. 5 is a 3D exploded schematic view showing another embodiment of the present invention.

Furthermore, please refer to FIG. 5 for the illustration of the combination means between the heat sink 21 and the cooling fan 22, which can be realized by providing a pressing portion 221 protruded beyond each of two opposite side edges of an outer frame of the cooling fan 22 and mounting two hooks 232 and a stopper 233 on a bottom surface of each of the two pressing portion for the mutual engagement with the respective retention flange 212 of the heat sink 21.

In sum, by means of the retentioner of the present invention, the production process can be simplified, thereby reducing its production cost. From the above-mentioned characteristics those features not only have a novelty among similar products and a progressiveness but also have an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A cooling module retentioner, comprising:
 a fixing base mounted on a circuit board to surround a heat-generating electronic component at a center, enabling a cooling module to be disposed in direct contact with said heat-generating electronic component, and having a rising corner column located at each of four corners thereof and equipped with a retention hole; and
 a flexible frame composed of two M-like retention brackets integrally combined with two connection bars, having a retention hook at each bottom end of said two M-like retention brackets for snapping in said retention hole of said fixing base respectively, and having a pivot part disposed at a lower central location of each of said two M-like retention brackets for pivotally mounting a lever being a metal rod and having a protruded portion formed by integrally bending one end of said lever; wherein said cooling module has at least two pressing portions for said two retention brackets to stride across, and a fixing hook of each said retention bracket corresponding to said respective lever is provided for positioning said respective protruded portion
 wherein said cooling module comprises a heat sink and a cooling fan, said heat sink is closely in contact with said heat-generating electronic component to directly absorb and conduct heat generated from said heat-generating electronic component, said heat sink has a plurality of cooling fins thereon, and a retention flange is formed on an inner side of each of two outmost cooling fins
 and said cooling fan is fixed on an integration base, a through hole is formed at a position corresponding to an air outlet zone of said cooling fan, the at least two pressing portions are projected outwardly from each of two opposite sides respectively, a plurality of hooks and a plurality of stoppers are disposed on a bottom side of said pressing portions, said plural hooks are engaged with said two retention flanges of said heat sink respectively, and said plural stoppers exactly block two ends of said retention flanges respectively.

2. The cooling module retentioner of claim 1, wherein a limit block is disposed on each of said pressing portion.

3. The cooling module retentioner of claim 1, wherein an included angle formed between said lever and said protruded portion is around 90°.

4. A cooling module retentioner, comprising:
 a fixing base mounted on a circuit board to surround a heat-generating electronic component at a center, enabling a cooling module to be disposed in direct contact with said heat-generating electronic component, and having a rising corner column located at each of four corners thereof and equipped with a retention hole; and
 a flexible frame composed of two M-like retention brackets integrally combined with two connection bars, having a retention hook at each bottom end of said two M-like retention brackets for snapping in said retention hole of said fixing base respectively, and having a pivot part disposed at a lower central location of each of said two M-like retention brackets for pivotally mounting a lever being a metal rod and having a protruded portion formed by integrally bending one end of said lever;

wherein said cooling module has at least two pressing portions for said two retention brackets to stride across, and a fixing hook of each said retention bracket corresponding to said respective lever is provided for positioning said respective protruded portion wherein said cooling module comprises a heat sink and a cooling fan, said heat sink is closely in contact with said heat-generating electronic component to directly absorb and conduct heat generated from said heat-generating electronic component, said heat sink has a plurality of cooling fins thereon, and a retention flange is formed on an inner side of each of two outmost cooling fins wherein the at least two pressing portions protrude beyond each of two opposite sides of an outer frame of said cooling fan respectively, a plurality of hooks and a plurality of stoppers are disposed on a bottom side of each of said two pressing portions, said plural hooks are engaged with said retention flange of said heat sink respectively, and said plural stoppers exactly block two ends of each of said two retention flanges respectively.

5. The cooling module retentioner of claim 4, wherein a limit block is disposed on each of said pressing portion.

6. The cooling module retentioner of claim 4, wherein an included angle formed between said lever and said protruded portion is around 90°.

* * * * *